United States Patent
Hicks et al.

(10) Patent No.: US 6,837,720 B2
(45) Date of Patent: Jan. 4, 2005

(54) CONNECTOR FOR ELECTRICALLY COUPLING ONE OR MORE DEVICES IN A PROCESSOR-BASED SYSTEM

(75) Inventors: Patrick P. Hicks, San Diego, CA (US); Gary L. Gilbert, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/995,226

(22) Filed: Nov. 27, 2001

(65) Prior Publication Data

US 2003/0100198 A1 May 29, 2003

(51) Int. Cl.[7] .................................................. H01R 9/09
(52) U.S. Cl. .......................... 439/79; 439/608; 439/701
(58) Field of Search .......................... 439/79, 80, 608, 439/701, 65

(56) References Cited

U.S. PATENT DOCUMENTS

| | | | |
|---|---|---|---|
| 3,181,101 A | * | 4/1965 | Fox |
| 4,820,169 A | * | 4/1989 | Weber et al. .................. 439/65 |
| 4,938,701 A | * | 7/1990 | Heberling ..................... 439/65 |
| 5,066,236 A | * | 11/1991 | Broeksteeg ................... 439/79 |
| 5,116,239 A | * | 5/1992 | Siwinski ..................... 439/497 |
| 5,236,375 A | | 8/1993 | Kachlic |
| 5,305,182 A | * | 4/1994 | Chen ........................... 439/65 |
| 5,454,726 A | * | 10/1995 | Lee et al. ..................... 439/65 |
| 5,472,354 A | * | 12/1995 | Chen et al. .................... 439/65 |
| 5,511,984 A | | 4/1996 | Olson et al. |
| 5,552,965 A | * | 9/1996 | Habegger .................... 361/801 |
| 5,591,036 A | | 1/1997 | Doi et al. |
| 5,616,034 A | * | 4/1997 | Masuda et al. ................ 439/78 |
| 5,648,891 A | * | 7/1997 | Gierut .......................... 439/65 |
| 5,713,746 A | | 2/1998 | Olson et al. |
| 5,793,617 A | * | 8/1998 | Dent ........................... 361/785 |
| 5,860,816 A | * | 1/1999 | Provencher et al. .......... 439/79 |
| 6,036,506 A | | 3/2000 | Korsunsky |
| 6,075,704 A | * | 6/2000 | Amberg et al. ............... 439/74 |
| 6,261,104 B1 | * | 7/2001 | Leman ......................... 439/61 |

OTHER PUBLICATIONS

HDM/HDM publication, Teradyne, Inc. Connection Systems Div., pp. 2–4, Apr. 1995.*

* cited by examiner

Primary Examiner—Neil Abrams
(74) Attorney, Agent, or Firm—Meyertons Hood Kivlin Kowert & Goetzel, P.C.; B. Noël Kivlin

(57) ABSTRACT

The present invention provides a method and a connector for coupling one or more boards together substantially parallelly. The connector comprises a first and a second supporting member and a first set of electrical connectors adapted to couple to a first board. The connector further comprises a second set of electrical connectors disposed between the first and second supporting member, wherein the second set of electrical connectors are oriented substantially perpendicular to the first set of electrical connectors and wherein the second set of electrical connectors are adapted to couple to a second board that is substantially parallel to the first board.

17 Claims, 7 Drawing Sheets

CONNECTOR FOR ELECTRICALLY COUPLING ONE OR MORE DEVICES IN A PROCESSOR-BASED SYSTEM

BACKGROUND OF THE INVENTION

1. Field of the Invention

This invention relates generally to connectors, and, more particularly, to a connector for electrically coupling one or more devices in a processor-based system.

2. Description of the Related Art

Generally, electrical devices, such as processor-based systems, are comprised of printed circuit boards (PCBs). These PCBs are commonly electrically coupled together via a variety of connectors. In addition to the ability to electrically interconnect the PCBs, a connector may also allow a system designer to physically restrain and orient the PCBs in any desirable manner relative to other PCBs within a processor-board system. Orientation of the PCBs, relative to one another or other devices, may be of particular interest to system designers of server systems, which may include numerous PCBs that interface with each other within a finite amount of space available in the system cabinet or housing of the server systems.

It is generally desirable to construct system cabinets of server systems to a certain, pre-selected size for delivery and installation reasons. This may be particularly true for physically large-sized server systems, such as mid-range server systems or large-scale server systems. As an example, for server systems that are relatively large in size, it is useful to design the cabinet's overall dimension so that the cabinet may pass through conventionally sized hallways, doors, elevator openings, and so forth.

A single mid-range server system, for example, may have a plurality of system boards that may be configured as one or more domains, where a domain, for instance, may act as a separate machine by running its own instance of an operating system to perform one or more of the configured tasks.

The benefits of providing substantially independently operating domains within an integrated system become readily apparent as customers are able to perform a variety of tasks that would otherwise be reserved for several different machines. However, because of the large number of boards that may exist within such systems, it may be desirable to have connectors that allow one or more boards to be efficiently oriented or positioned relative to each other within the system cabinet.

SUMMARY OF THE INVENTION

In one aspect of the instant invention, a connector is provided for coupling one or more boards together substantially parallel. The connector comprises a first and a second supporting member and a first set of electrical connectors adapted to couple to a first board. The connector further comprises a second set of electrical connectors disposed between the first and second supporting member, wherein the second set of electrical connectors are oriented substantially perpendicular to the first set of electrical connectors and wherein the second set of electrical connectors are adapted to couple to a second board that is substantially parallel to the first board.

In another aspect of the present invention, a method is provided for coupling one or more boards together substantially parallelly. The method comprises coupling a connector to a first printed circuit board. The method further comprises coupling a second printed circuit board to the first printed circuit board using the connector, wherein the coupled first and second printed circuit boards are substantially parallel to each other.

BRIEF DESCRIPTION OF THE DRAWINGS

The invention may be understood by reference to the following description taken in conjunction with the accompanying drawings, in which like reference numerals identify like elements, and in which.

Figure 1:
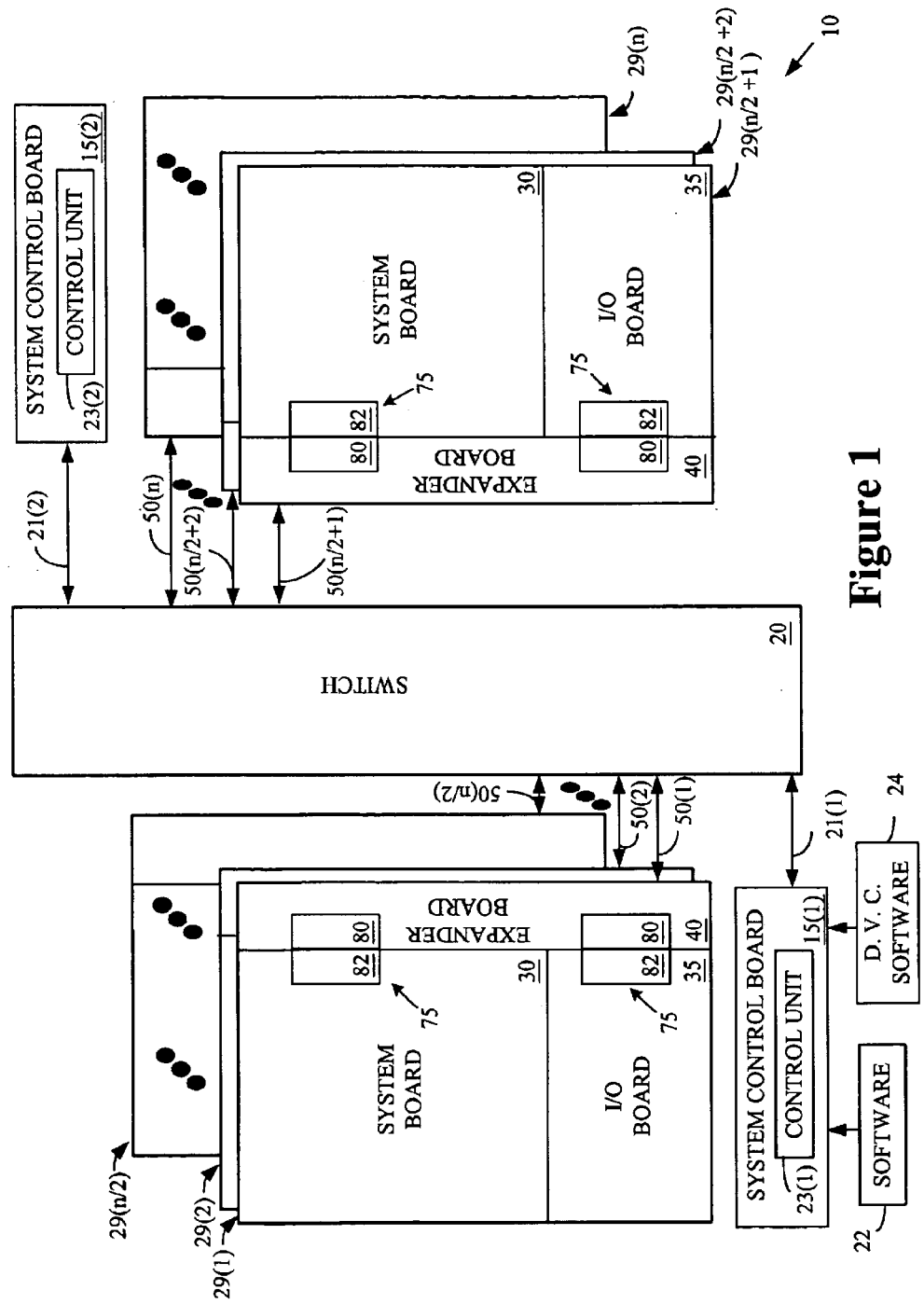
FIG. 1 shows a stylized block diagram of a system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As will be described in more detail below, one or more embodiments of the present invention allow coplanar or substantially parallel printed circuit boards to be coupled together within a processor-based system. As such, the printed circuit boards of the processor-based system may be efficiently oriented or positioned in a manner to fit within a system cabinet of a desired size and shape.

Referring now to FIG. 1, a block diagram of a system 10 in accordance with one embodiment of the present invention is illustrated. The system 10, in one embodiment, includes a plurality of system control boards 15(1-2) that are coupled to a switch 20. For illustrative purposes, lines 21(1-2) are utilized to show that the system control boards 15(1-2) are coupled to the switch 20, although it should be appreciated that, in other embodiments, the boards 15(1-2) may be coupled to the switch in any of a variety of ways, including by edge connectors, cables, or other available interfaces.

In the illustrated embodiment, the system 10 includes two control boards 15(1-2), one for managing the overall operation of the system 10 and the other to provide redundancy and automatic failover in the event that the other board fails. Although not so limited, in the illustrated embodiment, the first system control board 15(1) serves as a "main" system control board, while the second system control board 15(2) serves as an alternate hot-standby replaceable system control board. In one embodiment, during any given moment, generally one of the two system control boards 15(1-2) actively controls the overall operations of the system 10.

If failures of the hardware or software occur on the main system control board 15(1) or failures on any hardware control path from the main system control board 15(1) to other system devices occur, the system controller failover software 22 automatically triggers a failover to the alternative control board 15(2). The alternative system control board 15(2), in one embodiment, assumes the role of the main system control board 15(1) and takes over the main system controller responsibilities. To accomplish the transition from the main system control board 15(1) to the alternative system control board 15(2), it may be desirable to replicate the system controller data, configuration, and/or log files on both of the system control boards 15(1-2). The system control boards 15(1-2) in the illustrated embodiment may each include a respective control unit 23(1-2).

The system 10, in one embodiment, includes a plurality of system board sets 29(1-n) that are coupled to the switch 20, as indicated by lines 50(1-n). The system board sets 29(1-n) may be coupled to the switch 20 in one of several ways, including edge connectors or other available interfaces. The switch 20 may serve as a communications conduit for the plurality of system board sets 29(1-n), half of which may be connected on one side of the switch 20 and the other half on the opposite side of the switch 20.

The switch 20, in one embodiment, may be an 18×18 crossbar switch that allows system board sets 29(1-n) and system control boards 15(1-2) to communicate, if desired. Thus, the switch 20 may allow the two system control boards 15(1-2) to communicate with each other or with other system board sets 29(1-n), as well as allow the system board sets 29(1-n) to communicate with each other.

The system board sets 29(1-n), in one embodiment, comprise one or more boards, including a system board 30, I/O board 35, and expander board 40. The system board 30 may include processors and associated memories for executing, in one embodiment, applications, including portions of an operating system. The I/O board 35 may manage I/O cards, such as peripheral component interface cards and optical cards that are installed in the system 10. The expander board 40, in one embodiment, generally acts as a multiplexer (e.g., 2:1 multiplexer) to allow both the system and I/O boards 30, 35 to interface with the switch 20, which, in some instances, may have only one slot for interfacing with both boards 30, 35.

In one embodiment, the system 10 may be dynamically subdivided into a plurality of system domains, where each domain may have a separate boot disk (to execute a specific instance of the operating system, for example), separate disk storage, network interfaces, and/or I/O interfaces. Each domain, for example, may operate as a separate machine that performs a variety of user-configured services. For example, one or more domains may be designated as an application server, a web server, database server, and the like. In one embodiment, each domain may run its own operating system (e.g., Solaris operating system) and may be reconfigured without interrupting the operation of other domains.

In the illustrated embodiment, an interface 75 couples together one or more substantially parallel boards, including boards that lie in the same plane. For example, as shown in FIG. 1, the interface 75 connects the edges of the expander board 40 and the system board 30, both of which lie substantially in the same plane. As an additional example, the interface 75 connects the edges of the expander board 40 and the I/O board 35. Similarly, other boards in the system 10 may be coupled to each other using the interface 75, if desired.

Figure 2B:
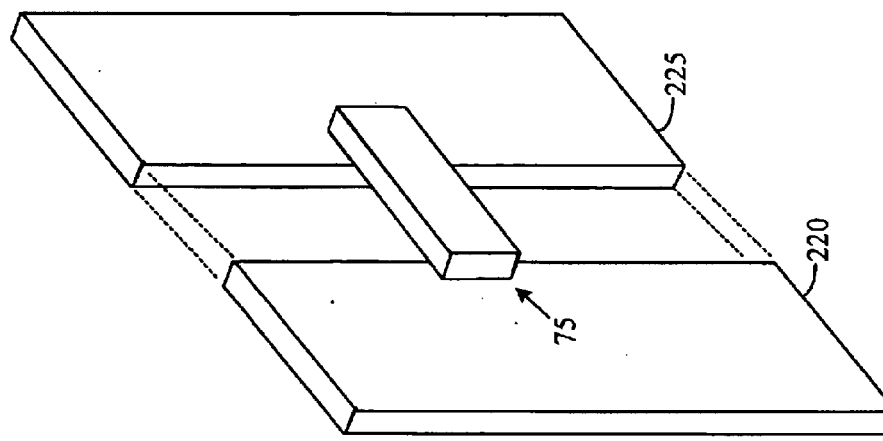
FIG. 2 illustrates an isometric view of two boards of the system of FIG. 1 coupled parallelly and coplanarly, in accordance with one embodiment of the present invention.
Figure 2A:
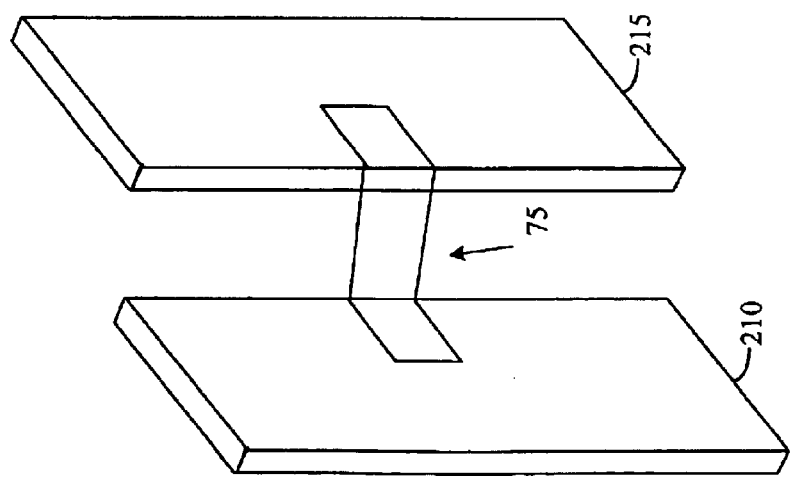

In one embodiment, the interface 75 may also connect boards that are substantially parallel to each other, but do not lie in the same plane. For example, as shown in FIG. 2A, the two boards 210, 215, which are not necessarily in the same plane but are substantially parallel to each other, are connected by the interface 75. Two substantially parallel boards 210, 215 that are coupled by the interface 75 are hereinafter referred to as "parallelly" coupled. Boards 220, 225 that lie substantially in the same plane, as shown in FIG. 2B, and are coupled by the interface 75 are hereinafter referred to as "coplanarly" coupled. As utilized herein, the term "parallelly" coupled is intended to include boards that are "coplanarly" coupled.

Referring again to FIG. 1, in the illustrated embodiment, each interface 75 includes a first connector 80 and a second connector 82, wherein the first and second connectors 80, 82 are capable of interfacing with each other. The first and second connectors 80, 82 may engage or mate with each other, for example. In one embodiment, the first connector 80 may be a male connector and the second connector 82 may be a female connector, or vice-versa. For illustrative purposes, it is herein assumed that the first connector 80 is a male connector and the second connector 82 is a female connector.

Figure 3:
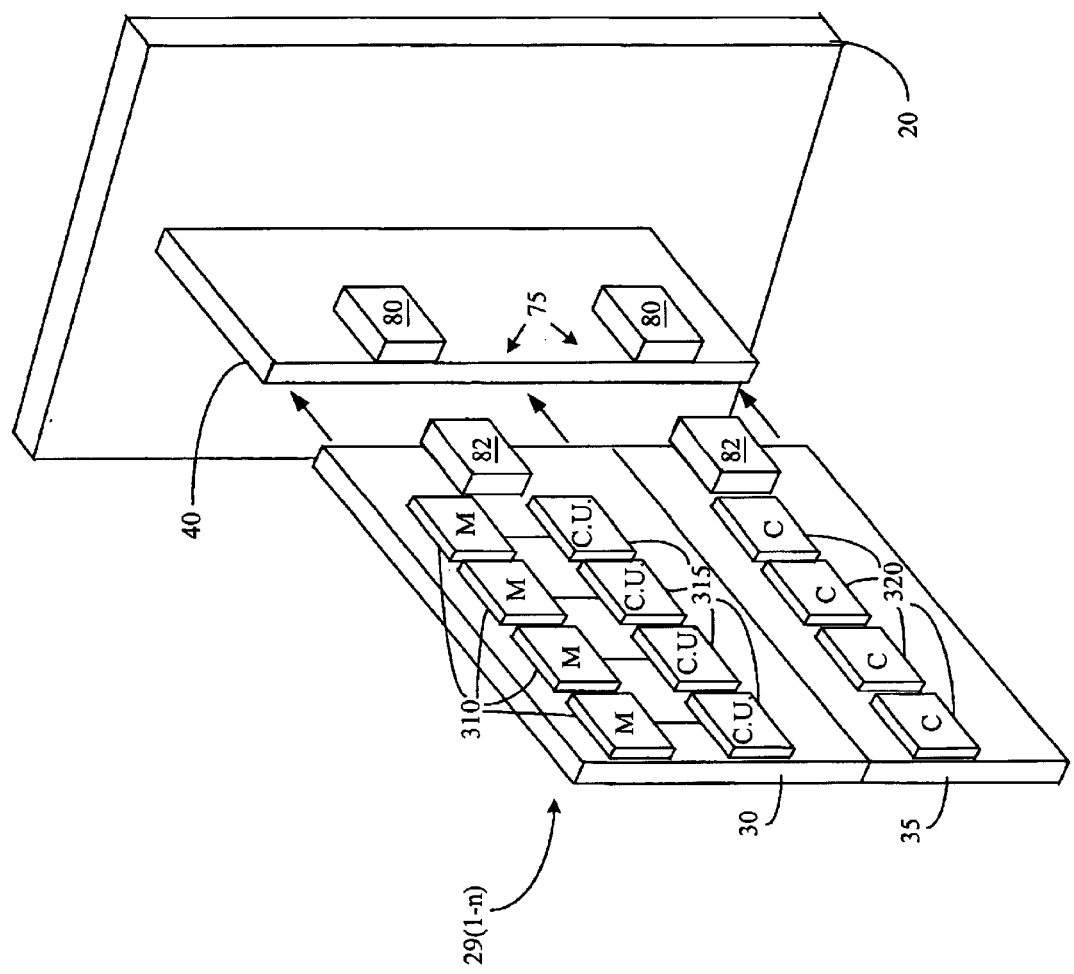
FIG. 3 depicts an exploded view of a system board, I/O board, and expander board of the system of FIG. 1, in accordance with one embodiment of the present invention.

Referring now to FIG. 3, an exploded stylistic view of an exemplary system board set 29(1-n) coupled to the switch 20 is illustrated. As is evident from the view of FIG. 3, the system board 30 and the I/O board 35 may each be coplanarly coupled to the expander board 40 by mating the respective connectors 82, 80 of the interface 75. In the illustrated embodiment, the system board 30 may include one or more memory units 310 coupled to one or more control units 315. Each control unit 315 may be a microprocessor, a microcontroller, a digital signal processor, a processor card (including one or more microprocessors or controllers), or other control or computing devices. In the illustrated embodiment, the I/O board 35 includes one or more controllers for performing one of a variety of control functions for the I/O board 35.

Figure 4:
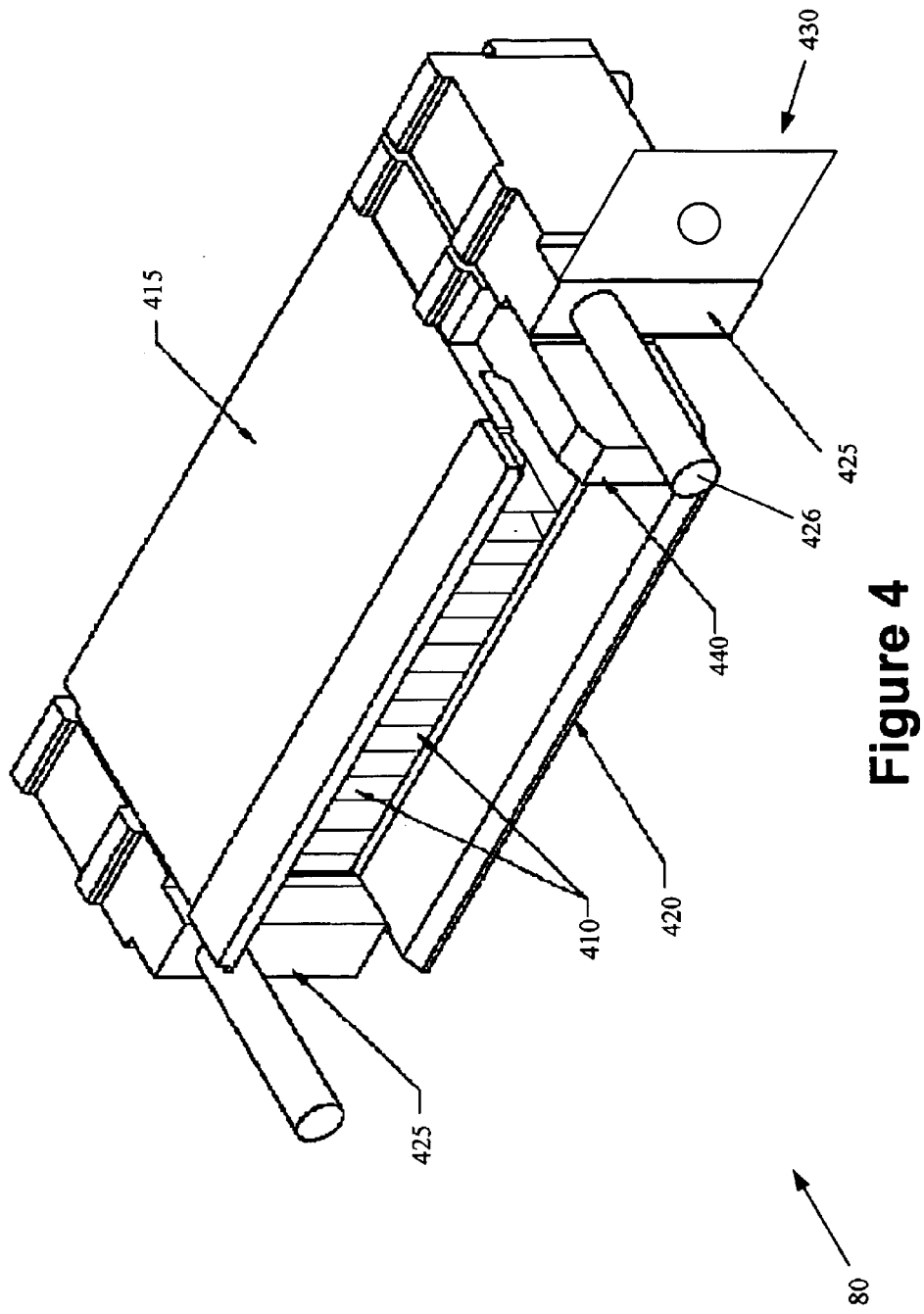
FIG. 4 is an isometric view of a connector that may be employed in the system of FIG. 1, in accordance with one embodiment of the present invention.
Figure 5A:
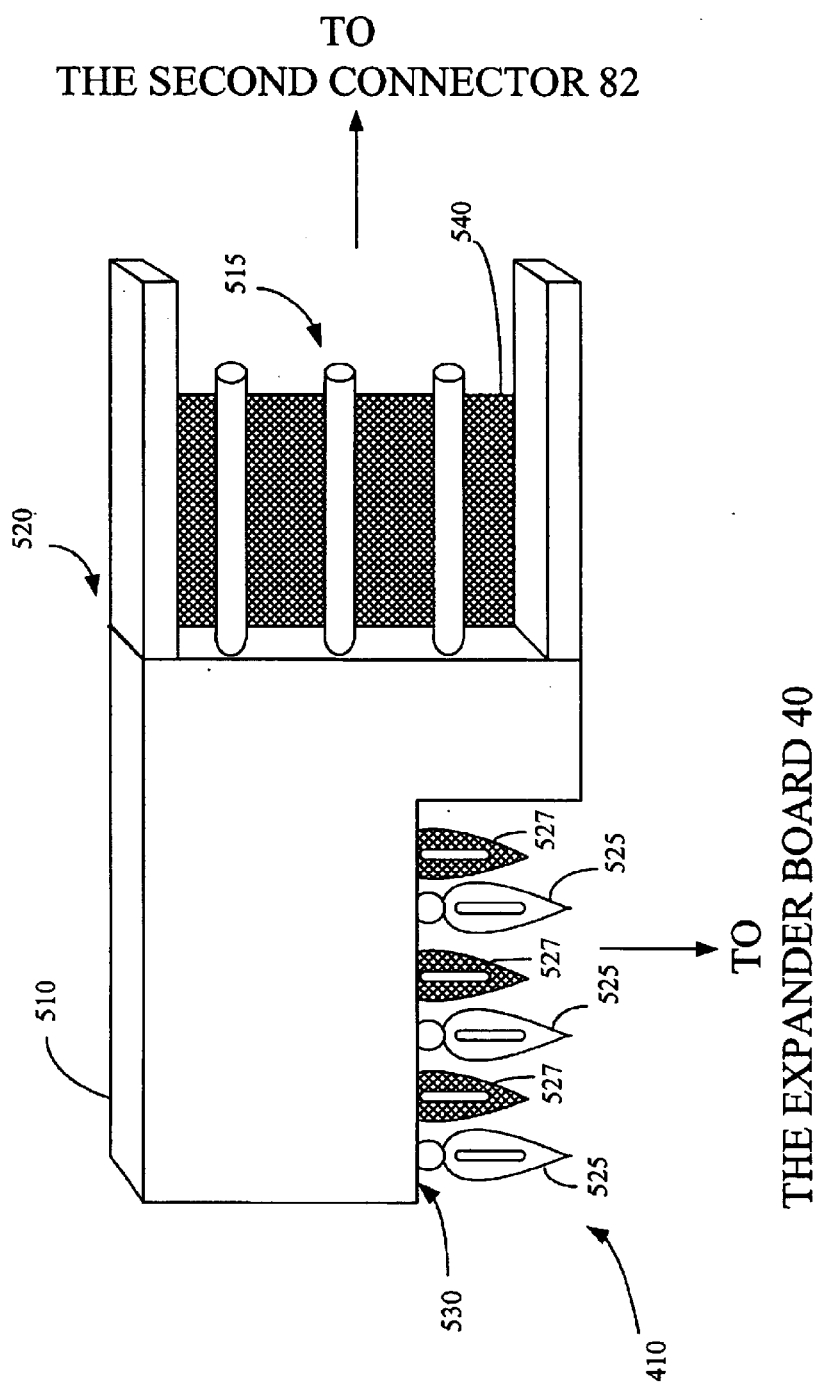
FIG. 5A illustrates an isometric view of a wafer that may be employed by the connector of FIG. 4, in accordance with one embodiment of the present invention.
Figure 6:
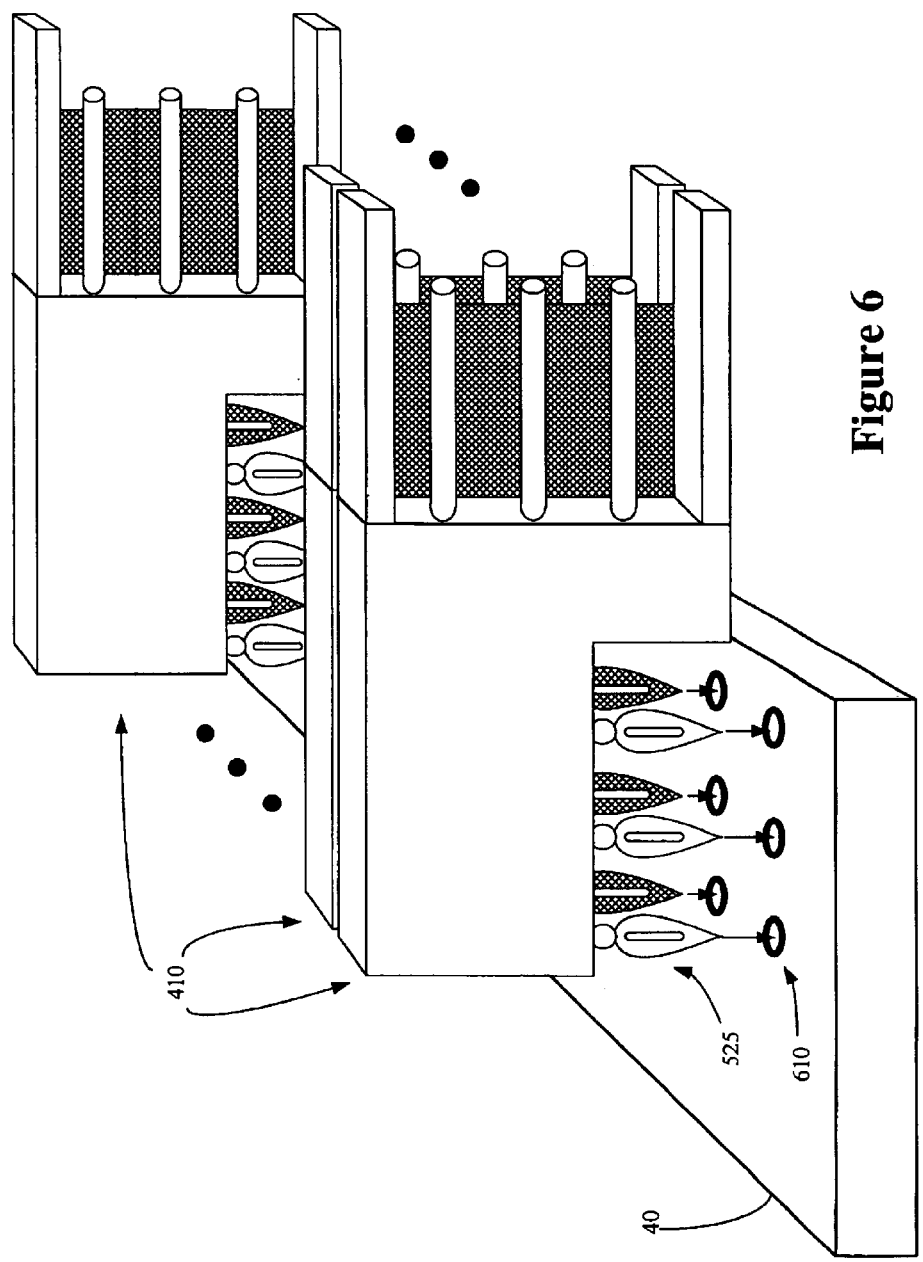
FIG. 6 depicts an isometric view of one of more wafers that may be employed by the connector of FIG. 4.

Referring now to FIG. 4, an isometric view of the first connector 80 is illustrated. The first connector 80 in the illustrated embodiment includes one or more discrete wafers 410 that are disposed between a top supporting member 415 and a bottom supporting member 420. The supporting members 415 and 420 may protect, as well as provide support to, the wafers 410. An example of the wafer 410 is shown in FIG. 5A, and an example of a plurality of the wafers 410 positioned adjacent each other is illustrated in FIG. 6. The first connector 80 further includes one or more guide modules 425, at least one power module 440, all of which are discussed in more detail below.

Referring now to FIG. 5A, a stylized isometric view of the wafer 410 that may be employed in the first connector 80 is illustrated, in accordance with one embodiment. The wafer 410 in the illustrated embodiment includes a first set 515 of electrical connectors extending from a first side 520 thereof, and a second set 525 of electrical connectors extending from a side 530 adjacent the first side 520. Each set 515, 525 of electrical connectors may include one or more pins (or other conductive material). The first set 515 of electrical connectors is adapted to engage one or more mating receptacles of the second connector 82 (see FIG. 1), which, as mentioned, may be a female connector. Those skilled in the art will appreciate that one or more conductive paths (not shown) may be disposed within each wafer 410 that electrically couple the first set of 515 electrical connectors to the second set 525 of electrical connectors.

The second set 525 of electrical connectors, which is oriented substantially 90 degrees with respect to the first set 515 of electrical connectors in the illustrated embodiment, is adapted to engage a board, which in the illustrated example is the expander 40 (see FIG. 1). In one embodiment, the second set 525 of electrical connectors may be compliant pins, which when inserted through one or more openings (shown in FIG. 6) of the expander board 40, expand and secure the wafer 410 in place. In an alternative embodiment, the second set 525 of electrical connectors may be pins that are secured using soldering or other available techniques.

The wafer 410 in the illustrated embodiment includes a conductive layer 540. The conductive layer 540 is adapted to interface with the second connector 82 and over which electrical signals may be transmitted. In one embodiment, the conductive layer 540 may serve as ground and serve as a shield to reduce the effects of undesirable fields or signals. The conductive layer 540, in one embodiment, is connected to one or more electrical connectors 527, which may be compliant pins, for example. The electrical connectors 527 may be inserted through one or more corresponding openings (shown in FIG. 6) of the expander board 40. Once inserted, the electrical connectors 527 may electrically couple the conductive layer 540 to the expander board 40, as well as aid in securing the wafer 410 to the expander board 40.

Figure 5B:
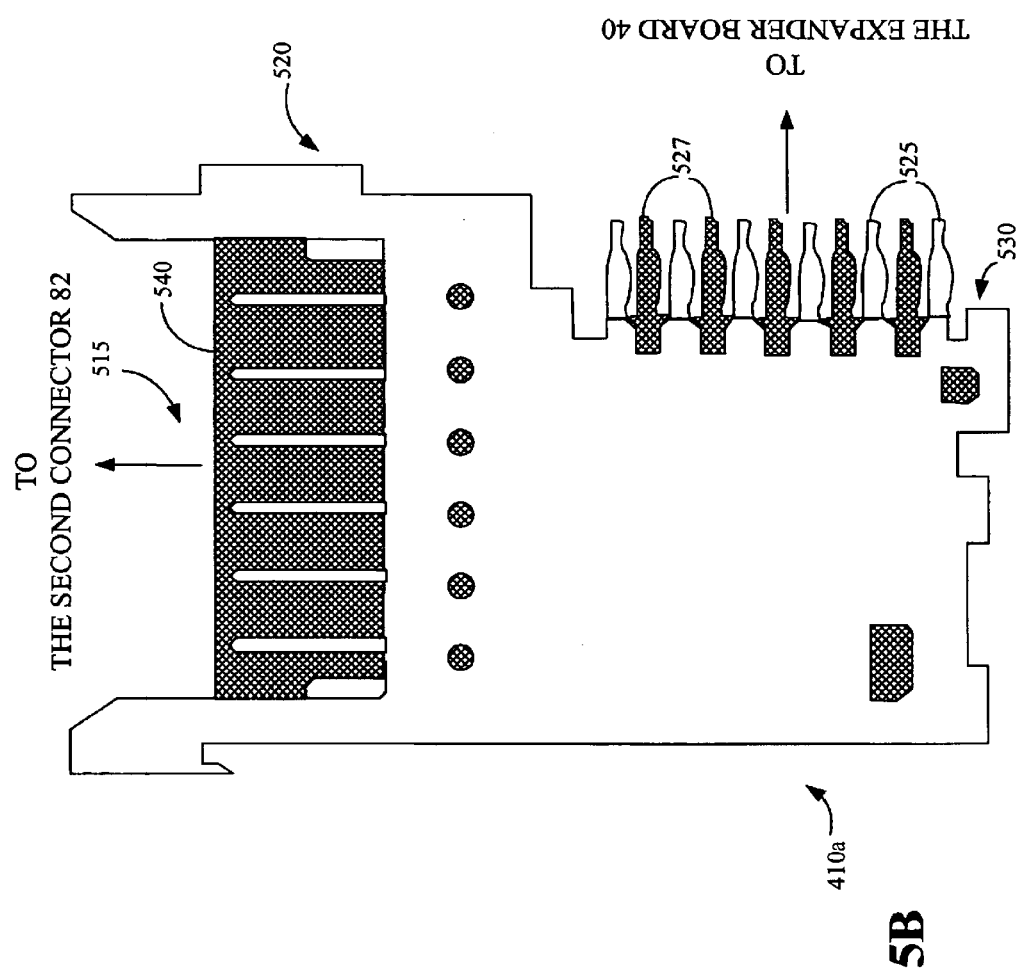
FIG. 5B illustrates an alternative embodiment of a wafer that may be employed by the connector of FIG. 4, in accordance with one embodiment of the present invention.

Referring now to FIG. 5B, an alternative embodiment of a wafer 410a is illustrated. The wafer 410a in the illustrated embodiment includes the first set 515 of electrical connectors extending from the first side 520 thereof, and the second set 525 of electrical connectors extending from a side 530 adjacent the first side 520. In the illustrated embodiment, the first set 515 includes six pins, where each pin has a corresponding pin in the second set 525 of electrical connectors. The first set 515 of electrical connectors is adapted to engage one or more mating receptacles of the second connector 82 (see FIG. 1), which, as mentioned, may be a female connector.

The second set 525 of electrical connectors, which is oriented substantially 90 degrees with respect to the first set 515 of electrical connectors in the illustrated embodiment, is adapted to engage a board, which in the illustrated example is the expander 40 (see FIG. 1). In one embodiment, the second set 525 of electrical connectors may be compliant pins, which when inserted through one or more openings (shown in FIG. 6) of the expander board 40, expand and secure the wafer 410a in place.

The wafer 410a in the illustrated embodiment includes a conductive layer 540 (shown using crosshatch). The conductive layer 540 is adapted to interface with the second connector 82 and over which electrical signals may be transmitted. In one embodiment, the conductive layer 540 may serve as ground and serve as a shield to reduce the effects of undesirable fields or signals. The conductive layer 540, in one embodiment, is connected to one or more electrical connectors 527, which may be compliant pins, for example. The electrical connectors 527 may be inserted through one or more corresponding openings (shown in FIG. 6) of the expander board 40. Once inserted, the electrical connectors 527 may electrically couple the conductive layer 540 to the expander board 40, as well as aid in securing the wafer 410a to the expander board 40.

Referring now to FIG. 6, a plurality of wafers 410 placed adjacent each other are shown. As mentioned, the first connector 80 may include one or more wafers 410. The number of wafers 410 utilized in the first connector 80 is a matter of design choice. The plurality of wafers 410, in one embodiment, are secured and protected by the supporting members 415, 420 (not shown in FIG. 6 for clarity and ease of illustration, but are shown in FIG. 4). As shown, the second set 525 of electrical connectors of each wafer 410 may be inserted in a set 610 of corresponding openings of the expander board 40. The second set 525 of pins, once inserted in the set 610 of openings, may expand and hold the wafer 410 in place.

Referring again to FIG. 4, the first connector 80 includes one or more guide modules 425. The guide modules 425 aid in aligning the first connector 80 with the second connector 82. For example, as the first connector 80 is coupled to the second connector 82, the guide modules 425 may be inserted in guide receptacles (not shown) of the second connector 82 for proper and easy alignment. The shape and size of the guide modules 425 may vary from one implementation to another, but generally, a guide pin 426 extends from the guide module 425 in a direction generally toward the second connector 82. The guide pin 426 engages a corresponding opening formed in the second connector 82 such that the first and second connectors 80, 82 slidingly engage one another with the set 515 of electrical connectors in the wafer 410 of the first connector 80 aligned with corresponding receptacles in the corresponding wafers (not shown) of the second connector 82.

In the illustrated embodiment, the first connector 80 includes at least one joinder module 430. The joinder module 430 allows one or more connectors 80 to be connected in series. In one embodiment, the joinder module 430, which may itself connect the connectors 430, is secured to the expansion board 40. Any suitable manner of securely joining one or more first connectors 80 to each other may be employed.

The first connector 80, in the illustrated embodiment, includes at least one power module 440. The power module 440 is adapted to receive power from a power supply source and deliver it to another location. For example, in the illustrated embodiment of FIG. 1, the power module 440 of the first connector 80 receives power from the switch 20 and provides the power to one or more components of the system board 30 or the I/O board 35 through the second connector 82. That is, in one embodiment, the second connector 82 may include a corresponding power module (not shown) that receives the power from the power module 440 of the first connector 80 and delivers it to control units 315 of the system board 30 or controllers 320 of the I/O board 35. The power module 440 may, for example, be capable of delivering higher-voltage signals than the first set 515 of electrical connectors of the wafer 410 (see FIG. 5A). In one embodiment, the power module 440 may deliver about a 48-volt signal, while the first set 515 of electrical connectors may deliver signals of lower voltages, such as 2–4 volts.

The first connector 80 allows one or more boards (e.g., the system board 30, the I/O board 35, expansion board 40, system control board 15(1-2)) to be parallelly coupled, which may offer system designers the added flexibility of orienting the coupled boards in a manner that fit server cabinets that are of various shapes and sizes. In some instances, from a transportability perspective, it may be advantageous to parallelly couple boards to construct a system that is longer than it is wider (e.g., as opposed to a squared-shaped system). This is because a rectangular-shaped system 10 may more readily pass through a variety of hallways, doors, elevator openings, and other entrances, which may not have otherwise been possible.

One or more embodiments of the first connector 80 may be compatible with one or more of the standard right angle female connectors. The first connector 80, in one embodiment, may emulate a standard vertical backplane connector in fit and function. Furthermore, the first connector 80, in one embodiment, may be a high-performance connector.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A processor-based system, comprising:
    a first board;
    a second board; and
    a first connector coupled to the first board, comprising:
        a first set of one or more wafers, comprised between a top supporting member and a bottom supporting member, with one or more electrical connectors, wherein the one or more electrical connectors are coupled to one or more first pins, wherein the one or more first pins are oriented substantially ninety degrees from the one or more electrical connectors and coupled to the first board;
        a first power module;
        a first guide module for aligning the first connector with a second connector coupled to the second board, wherein the first power module and the first guide module are outside an enclosure formed by the top and bottom supporting members, and wherein the second connector comprises:
            a second set of one or more wafers with one or more mating receptacles, wherein the one or more mating receptacles receive the one or more electrical connectors, wherein the one or more mating receptacles are coupled to one or more second pins, wherein the one or more second pins are oriented substantially ninety degrees from the one or more mating receptacles and coupled to the second board;
            a second power module to couple to the first power module to electrically couple the first connector to the second connector; and
            a second guide module for aligning the second connector with the first connector to parallelly couple the first board to the second board.

2. The processor-based system of claim 1, wherein the first connector is a male connector.

3. The processor-based system of claim 1, wherein the first guide module and the second guide module comprise one or more guide pins for aligning the first connector with the second connector.

4. The processor-based system of claim 1, wherein the second connector further comprises a first support member and a second support member with one or more contact modules disposed therein.

5. The processor-based system of claim 1, wherein the first board is at least one of an I/O board and a system board, and wherein the second board is an expander board.

6. The processor-based system of claim 1, wherein the first connector and the second connector are adapted to planarly couple the first board to the second board.

7. An apparatus, comprising:
    a first board;
    an expander board;
    a first connector having a first end adapted to be coupled to the first board and a second end adapted to be coupled to a second connector coupled to the expander board, wherein the first board and the expander board are coupled substantially in parallel when the first connector is coupled to the second connector, the first connector comprising:
        one or more wafers comprised between a toy supporting member and a bottom supporting member, wherein the one or more wafers comprises:
            a first set of electrical connectors to couple to one or more mating receptacles on the second connector, wherein the first set of electrical connectors is coupled to a set of corresponding pins, wherein the set of corresponding pins are oriented substantially ninety degrees to the first set of electrical connectors;
            a conductive layer coupled to one or more compliant pins, wherein the one or more compliant pins coupled to the conductive layer secure the one or more wafers to the expander board;
        a power module; and
        a first guide module for aligning the first connector with the second connector coupled to the expander board comprising a guide pin, wherein the first guide module aligns the first connector with a second guide module on the second connector coupled to the expander board, wherein the second guide module comprises a corresponding opening for the guide pin to align the first connector and the second connector by slidingly engaging the guide pin, and wherein the power module and the first guide module are outside an enclosure formed by the top and bottom supporting members.

8. The apparatus of claim 7, wherein the expander board couples the first board to a switch.

9. A method, comprising:
    coupling a first connector to a first printed circuit board, wherein the first connector comprises one or more wafers between a top supporting member and a bottom supporting member and receives and delivers at least one first voltage;
    aligning the first connector with a second connector coupled to a second printed circuit board using a first guide module comprising a guide pin, wherein the first guide module aligns the first guide module on the first connector with a second guide module on the second connector, wherein the second guide module comprises a corresponding opening for the guide pin to slidingly engage the guide pin, wherein aligning the first connector with the second connector aligns the first printed circuit board and the second printed circuit board substantially parallel;

coupling the second printed circuit board to the first printed circuit board using the first connector and the second connector, wherein the coupled first and second printed circuit boards are substantially parallel to each other; and providing power at a second voltage from the first printed circuit board to the second printed circuit board using a power module in the first connector, wherein the second voltage is larger than the first voltage, and wherein the power module and the first guide module are outside an enclosure formed by the top and bottom supporting members.

10. The method of claim 9, wherein the first connector includes a first set of electrical connectors and a second set of electrical connectors positioned substantially perpendicular to each other, wherein coupling the first connector to the first printed circuit board comprises coupling the first set of electrical connectors to the first printed circuit board.

11. The method of claim 10, wherein coupling the first set of electrical connectors to the first printed circuit board comprises inserting the first set of electrical connectors through one or more openings in the first printed circuit board, wherein the electrical connectors contract into and hold in the openings.

12. The method of claim 10, wherein coupling the second printed circuit board to the first printed circuit board comprises coupling the second set of electrical connectors to the second printed circuit board.

13. The method of claim 10, wherein the second connector has one or more receptacles, wherein coupling the second set of electrical connectors to the second printed circuit board comprises inserting the second set of electrical connectors in the one or more receptacles of the second connector.

14. The method of claim 9, wherein the first voltage is about 2–4 volts and the second voltage is about 48 volts.

15. A connector, comprising:

one or more wafers comprised between a top supporting member and a bottom supporting member, wherein the one or more wafers includes a conductive layer to shield the one or more wafers from interference and wherein the conductive layer is coupled to one or more compliant pins that contract into one or more respective holes on an expander board to secure the one or more wafers to the expander board;

a power module; and a guide module to align the one or more wafers with a second connector, wherein the one or more wafers and the second connector couple the expander board and a circuit board substantially in parallel, and wherein the power module and the guide module are outside an enclosure formed by the top and bottom supporting members.

16. The connector of claim 15, wherein the circuit board is a system board or an input/output board.

17. The connector of claim 15, wherein the one or more wafers comprise a male connector and the second connector comprises a female connector.

* * * * *

UNITED STATES PATENT AND TRADEMARK OFFICE
CERTIFICATE OF CORRECTION

PATENT NO.    : 6,837,720 B2
DATED         : January 4, 2005
INVENTOR(S)   : Hicks et al.

It is certified that error appears in the above-identified patent and that said Letters Patent is hereby corrected as shown below:

Column 8,
Lines 30-31, please delete "between a toy supporting member" and substitute -- between a top supporting member --.

Signed and Sealed this

Twelfth Day of July, 2005

JON W. DUDAS
*Director of the United States Patent and Trademark Office*